(12) United States Patent
Ohno et al.

(10) Patent No.: US 7,141,992 B2
(45) Date of Patent: Nov. 28, 2006

(54) METHOD FOR MEASURING IMPURITY METAL CONCENTRATION

(75) Inventors: Ryuuji Ohno, Kanagawa (JP); Kei Matsumoto, Kanagawa (JP)

(73) Assignee: Komatsu Electronic Metals Co., Ltd., Kanagawa (JP)

( * ) Notice: Subject to any disclaimer, the term of this patent is extended or adjusted under 35 U.S.C. 154(b) by 0 days.

(21) Appl. No.: 11/114,092

(22) Filed: Apr. 26, 2005

(65) Prior Publication Data

US 2006/0066324 A1    Mar. 30, 2006

(30) Foreign Application Priority Data

Apr. 26, 2004    (JP) .............................. 2004-130234

(51) Int. Cl.
*G01R 31/302* (2006.01)
(52) U.S. Cl. ...................... 324/750; 324/765; 702/183
(58) Field of Classification Search ........ 324/750–752, 324/765–766; 702/22, 23, 27, 30, 86, 97, 702/104, 176, 183; 438/5, 7, 10, 14, 16, 438/17, 510
See application file for complete search history.

(56) References Cited

U.S. PATENT DOCUMENTS

| | | | | |
|---|---|---|---|---|
| 4,598,249 A | * | 7/1986 | Goodman et al. .......... 324/752 |
| 5,430,386 A | * | 7/1995 | Morin et al. ................ 324/765 |
| 5,453,703 A | * | 9/1995 | Goldfarb .................... 324/765 |
| 5,742,176 A | * | 4/1998 | Kato et al. .................. 324/765 |
| 5,804,981 A | * | 9/1998 | Lowell et al. .............. 324/752 |
| 6,512,384 B1 | * | 1/2003 | Lagowski et al. .......... 324/752 |
| 6,607,927 B1 | * | 8/2003 | Ramappa et al. ............ 438/14 |
| 6,804,981 B1 | * | 10/2004 | Maier ......................... 72/306 |
| 2004/0010394 A1 | * | 1/2004 | Koveshnikov .............. 702/183 |

OTHER PUBLICATIONS

G. Zoth, e t a l.; "A f ast p reparation-free m ethod t o detect iron in s ilicon"; A merican I nstitute o f Physics; Jun. 1, 1990; vol. 67, No. 11, pp. 6764-6771.

* cited by examiner

*Primary Examiner*—Jermele Hollington
*Assistant Examiner*—Arleen M. Vazquez
(74) *Attorney, Agent, or Firm*—Arent Fox PLLC

(57) ABSTRACT

There is provided a method for calculating a more accurate metal impurity concentration contained in a silicon wafer by correcting measured values with a calibration based on a dependent relationship of the minority carrier diffusion length with a period of time elapsing from the activation to the actual measurement, an electric resistivity, and a temperature if there is such a relationship, in the measurement of the metal impurity concentration by utilizing the surface photovoltage. In the calibration step, such dependent relationship may be obtained by utilizing the metal impurity concentration measured by methods of different principles and actually measured values are corrected in light of the dependent relationship in the measuring step such that the metal impurity concentration is measured more accurately.

5 Claims, 14 Drawing Sheets

- Fe is bonded to boron (B) to stay in bulk.
- Diffusion length measurement in Fe-B state ($L_{BF}$)
- Diffusion length measurement in $Fe_i$ ($L_{AF}$)

- Fe-B pair is dissociated.
- Increase of deep level ($Fe^+int$)
- Diffusion length becomes shorter after dissociation.
- Dissociated $Fe^+int$ works about 10 times more as a recombination center.

- $N_{Fe} = 1.1 \times 10^{16} (L_{AF}^{-2} - L_{BF}^{-2})$ [atoms/cm$^3$]

$\Phi/SPV = Const.(D/L+S_f)(1+Z/L)$ $\Phi$: Photon flux $Z$: Light penetration depth $L$: Minority carrier diffusion length $D$: Minority carrier diffusion coefficient $S_f$: Surface recombination speed Fig. 4    (Related Art)

$[Fe] = 1.1 \times 10^{16}[(1/L_{AF})^2 - (1/L_{BF})^2]$ ([Fe]:in /cm$^3$, L:in $\mu$m)

$L_{AF}$ is minority carrier diffusion length after optical activation
$L_{BF}$ is minority carrier diffusion length before optical activation
Storage time is period of elapsing time from the optical activation After 60 [min]
r=1[Ω cm]

After 60 [min]
P=6[Ω cm]

METHOD FOR MEASURING IMPURITY METAL CONCENTRATION

CROSS-REFERENCE TO RELATED APPLICATIONS

This application is based upon and claims the benefit of priority from the prior Japanese Patent Application No. 2004-130234 filed on Apr. 26, 2004, the entire contents of which are incorporated herein by reference.

FIELD OF THE INVENTION

The present invention relates to a method for measuring an impurity metal concentration contained in a silicon wafer.

RELATED ART

It is understood that it is more preferable to reduce impurity metal contamination in silicon wafers, and it becomes more and more important to reduce such impurity metal contamination as the degree of integration becomes higher. The impurity metal is easily diffused into bulk of silicon wafers by a heat treatment (or thermal annealing) or the like and changes characteristics of the silicon wafers after the thermal annealing. For example, if an iron (Fe) atom diffused into a p-type silicon wafer doped with boron (B) becomes a positive ion, and tends to form a pair with a negatively ionized boron at a substitutional site (hereinafter referred to as "Fe—B pair"). It is important to reduce such iron contamination since the Fe—B pair may deteriorate performance of a product silicon wafer. Therefore, it is desirable to measure metal impurities such as contaminated iron in a non-destructive way as accurate as possible. It will be possible to conduct an inspection at the manufacturing site of silicon wafer if a method for measuring concentrations of such metal impurities is established. Therefore, it may be easier to develop a method for manufacturing silicon wafers having extremely little metal contamination.

As one of such measuring methods, Surface Photovoltage method (hereinafter referred to as "SPV method") may be employed.

The SPV method is for measuring iron concentration by utilizing behavior of dissociated iron, which arises from iron bonded with boron (Fe—B pair) in the silicon wafers and dissociated by light irradiation or heat. The principle of the method is illustrated in FIG. 1. More specifically, the method may comprise measuring the minority carrier diffusion length (hereinafter referred to as "$L_{BF}$") in the silicon wafers in a condition that the iron forms a Fe—B pair; and irradiating light (hereinafter referred to as "optical activation") or applying heat (hereinafter referred to as "thermal activation") to the silicon wafers with enough energy for dissociating the Fe—B pair (forbidden band gap (or band gap) of semiconductor: 1.1 eV for silicon). Then, the Fe—B pair is dissociated with such activations so as to yield $Fe_i$ (hereinafter referred to as "interstitial Fe") and Bs (hereinafter referred to as "substitutional B"). In such a state, a minority carrier diffusion length (hereinafter referred to as "$L_{AF}$") is measured again.

Since the interstitial Fe has a deep energy level as compared to the Fe—B pair, it may be easier to capture minority carriers, and $L_{AF}$ is shorter than $L_{BF}$ as a result.

If $L_{AF}$ and $L_{BF}$ are measured, it is known that the iron concentration may be given by the equation (1) (J. Appl. Phys. Vol. 67, 6764, No. 11, 1 Jun. 1990). Eq. (1)

$$N_{Fe}=1.1\times10^{16}(L_{AF}^{-2}-L_{BF}^{-2}) \quad (1)$$

Here, $N_{Fe}$ is iron concentration.

An example of a measuring device 1 of SPV is illustrated in FIG. 2. The measuring device 1 comprises a halogen lamp 11 as a white light source, a light chopper 12, a filter rotation device 13, an optical fiber cable 14, an energy converter 15, a transmissive pick-up electrode (top electrode) 16, a lock-in amplifier 17, and a sample stage (bottom electrode) 19. A silicon wafer 18 is a sample in this embodiment. A white light (combined with lights of various wavelengths) is chopped with a predetermined wavelength by the light chopper 12 and is filtered to be a monochromatic light having a predetermined wavelength by a plurality of various kinds of wavelength filters which are provided to the filter rotation device 13, and then the monochromatic light is transmitted through the optical fiber cable 14 and irradiated on the silicon wafer 18.

Since a reachable distance in the depth direction from the sample surface (light penetration depth) depends on the light wavelength, it is possible to have lights penetrating to various depths corresponding to respective various wavelengths of the lights by irradiating such lights as the wavelength filters are changed by rotating the filter rotation device 13.

When the light is irradiated on the silicon wafer 18 as a sample, electron-hole pairs are generated and electrons behave as minority carriers. The electrons as being minority carriers diffuse in the wafer and are partially captured by recombination centers such as Fe—B pairs, defects and the like caused by metal impurities, and partially reach the surface of the wafer. Such minority carriers are detected by the transmissive pick-up electrode 16 such that the surface photovoltage (or photo surface electromotive force) is measured. Here, the light irradiated in the measurement does not have enough irradiation density (or photon flux density) [photons/cm²] to dissociate such Fe—B pairs as described above, but the light has some irradiation density to generate electron-hole pairs. In most cases, the irradiation dose for the optical activation is three to four orders of magnitude higher than the irradiation dose for the measurement.

The principle to obtain the minority carrier diffusion length from the surface photovoltage measured as described above is illustrated in FIG. 3. First, before the activation, surface photovoltages at a plurality of various depths are measured. The surface photovoltage SPV depends on the light penetration depth Z and the minority carrier diffusion length L and it is known that the equation (2) may apply these parameters. From the equation (2), the minority carrier diffusion length L is calculated by the measured surface photovoltage SPV. In an embodiment of FIG. 3, the measurement is conducted four times with four different irradiation lights of four light penetration depths (i.e., four wavelengths) from the surface into the bulk of the sample. More specifically, the first surface photovoltage SPV with the irradiation light of the first selected wavelength is measured, and the later surface photovoltages SPV with the irradiation lights of the later selected wavelengths are measured by correcting each photon flux (φ) such that each of the later surface photovoltages SPV becomes equal to the first surface photovoltage SPV. Eq. (2)

$$\phi/SPV=\text{Const.}(D/L+S_f)(1+Z/L) \quad (2)$$

Here, $\phi$ is the photon flux, D is the diffusion coefficient of the minority carrier, L is the minority carrier diffusion length, $S_f$ is the surface recombination rate, and Z is the light penetration depth.

In an embodiment of FIG. 3, the minority carrier diffusion length $L_{BF}$ may be shown as an intercept of an abscissa axis by the fitted curve (or line): $Z(\alpha^{-1})$, which indicates the above relationship.

Next, after the Fe—B pair is dissociated with the activation, surface photovoltages at a plurality of various depths are measured in the same way as described above. In the embodiment of FIG. 3, the measurement is conducted four times in the same way as described above. Similarly, the minority carrier diffusion length $L_{AF}$ may be obtained with the fitted curve (or line) based on these measured values. If the obtained $L_{AF}$ and $L_{BF}$ are substituted in the equation (1), the iron concentration may be given.

Also, since such measurement of surface photovoltages at a plurality of various depths as described above can evaluate the minority carrier diffusion lengths only near the measuring point, such measurements of minority carrier diffusion lengths are made, for example, at measuring points in the order from the center to the periphery for a plurality of times (entire map measurement by a device provided with an R-θ stage) so that the entire silicon wafer may be evaluated. In an actual measurement, minority carrier diffusion lengths $L_{BF}$ are measured at all measuring points on the silicon wafer before the activation, and minority carrier diffusion lengths $L_{AF}$ are measured at the same measuring points after activation. Here, in a method of the entire map measurement, it is not limited to the above example, but the measurement by a measuring device provided with an X-Y stage may be conducted.

The iron concentration measured by the SPV method is compared with the iron concentration measured by Deep-level Transient Spectroscopy method (DLTS method) in FIG. 4. As shown in the figure, the iron concentration by the SPV method matches the iron concentration by the DLTS method well (J. Appl. Phys. Vol. 67, 6764, No. 11, 1 Jun. 1990).

However, some phenomenon arises, which may affect the measurement of metal impurity concentration by the SPV method, in the silicon wafer having a low electric resistivity and a large diameter, which have been recently desired. The interstitial iron having been dissociated once from the Fe—B pair by the activation recombines with the substitutional boron so that it reforms the Fe—B pair as the time elapses. This recombination continues until almost all interstitial irons go back to the Fe—B pairs (that is, until such steady state as having been established before the activation is made). However, a longer period of time may elapse between the activation and the measurement of the minority carrier diffusion length at a more peripheral measuring point if a measuring device having a design (structure) to measure the minority carrier diffusion lengths in the order from the center to the periphery of the silicon wafer as described in the above example when many measuring points are measured by the SPV method. In a conventional silicon wafer having a small diameter and a high electric resistivity, effects by such recombination of the interstitial iron and the substitutional boron may be negligible so that the coefficient of $1.1 \times 10^{16}$ may apply to the equation (1) regardless of the elapsing time. Here, the elapsing time between the activation and the last measurement of the silicon wafer of 200 mm diameter is approximately 30 minutes with 177 measuring points. However, in the silicon wafer having a large diameter (e.g., being equal or larger than 300 [mm]) and a low electric resistivity (e.g., not exceeding 10 [Ω·cm]), it is expected that a larger number of measuring points are required so that the elapsing time has to be longer. Since the assumption that the measured $L_{AF}$ is in the state of 100% dissociation of Fe and B is not necessarily valid as the interstitial iron and substitutional boron are recombining with each other during the period between the activation and the measurement in these days when such silicon wafer is desired.

SUMMARY OF THE INVENTION

It is understood that the coefficient of the equation (1) should not be a constant value of $1.1 \times 10^{16}$ but the coefficient should be a variable value to increase as the time elapses from the activation to the actual measurement in order to cancel the calculation errors.

It is an object of the present invention to provide a method for measuring a metal impurity concentration in consideration of the electric resistivity, a period of elapsing time from the activation to the measurement of the minority carrier diffusion length, and a temperature of the silicon wafer so as to satisfy the above requirements.

For the above object, the following is provided according to the present invention.

(1) A method for measuring a metal impurity concentration in a silicon wafer by utilizing a surface photovoltage, comprising: a calibration step; and a measurement step, wherein the calibration step comprises the steps of: (A) a measurement section measures a minority carrier diffusion length prior to a calibration activation at the measuring point on a calibration silicon wafer; (B) an activation section conducts a calibration activation on said calibaration silicon wafer; (C) said measurement section measures the minority carrier diffusion length at said measuring point on said calibration silicon wafer aftern said calibration activation; (D) a calculation section calculates the dependence of the minority carrier diffusion length in Step (C) on at least one factor by inputting the minority carrier diffusion length in Step (A) and the minority carrier diffusion length in Step (C); (E) said measurement section measures a minority carrier diffusion length at a measuring point of a measurement silicon wafer before a measurement activation; (F) said activation section conducts the measurement activation of said measurement silicon wafer; (G) said measurement section measures the minority carrier diffusion length at said measuring point of the measurement silicon wafer after the measurement activation; and (H) said calculation section calculates the metal impurity concentration by inputting the minority carrier diffusion length measured in Step (E), the minority carrier diffusion length measured in Step (G), and said dependence such that said metal impurity concentration is calculated.

According to the present invention, when the metal impurity concentration is measured by the SPV method, if the measured minority carrier diffusion length depends on one or more factors during the period of elapsing time from the activation to the actual measurement of the minority carrier diffusion length (e.g., the measured diffusion length does not remain same during the period), such a dependence is measured or obtained during the calibration step and the metal impurity concentration is measured during the actual measuring step with the calibration based on the dependence. That is, once the dependence is measured or obtained, in the subsequent measuring stage, the minority carrier diffusion length may be measured and the measured values may be corrected with the calibration based on the dependence with the factors. In the calibaration step, if the metal impurity concentration is unkown, before Step (D), the method may comprise the step of obtaining the dependence at the calculation section by another method other than the SPV method, wherein the method for obtaining the dependence may include any one of a DLTS method, an atomic absorption spectroscopy, a SIMS method, a method utilizing a chemical analysis (e.g., a method for measuring impurity concentration in the solution in which a chip cut out from the wafer or an entire wafer is dissolved with acid solvent), and the like. The activation method may include any one of a method utilizing light irradiation (optical activation), a method utilizing heat (thermal activation), and the like. A usual thermal activation is conducted by annealing the wafer at 200 [° C.] for 3 [min] and quenching the wafer on an aluminum plate for 2 [min] immediately after the annealing. This annealing is usually made by utilizing heat conduction. The relationship between the annealing temperature and the dissociation of the Fe—B pair by this method is illustrated in "A fast, preparation-free method to detect iron in Silicon," Zoth and W. Bergholz J. Appl. Phys., Vol. 67, No. 11, 1 Jun. 1990.

(2) A method of measuring the metal impurity concentration contained in a slicion wafer by utilizing a surface photovoltage, comprising the steps of: (I) the measurement section measures the minority carrier diffusion length at a measuring point of a measurement silicon wafer before an activation; (J) an activation section carries out the activation on said measurement silicon wafer; (K) said measurement section measures the minority carrier diffusion length at the measuring point on the measurement silicon wafer after the activation; (L) a calculation section calculates said metal impurity concentration by inputing the minority carrier diffusion length in Step (I), the minority carrier diffusion length in Step (K), and a predetermined dependence of the minority carrier diffusion length in Step (K) on at least one factor.

According to the present invention, if the dependent relationship is obtained beforehand by the prior calibration, the obtained dependent relationship may be utilized to calculate the metal impurity concentration. Here, the method for the activation may include any one of a method utilizing the light irradiation, a method utilizing heat, and the like as described above with the above (1) case.

(3) The method according to (1), wherein said at least one factor includes a period of elapsing time from the calibration activation in Step (B) to the measurment of the minority carrier diffusion length in Step (C).

According to the present invention, if each period of elapsing time from the activation to the actual measurement of the minority carrier diffusion length varies for each measuring point, the metal impurity concentration may be evaluated by each corresponding correction for each point. When the metal impurity concentrations are measured at various measuring points with various periods of time elapsing until the actual measurement in the SPV method, with a calibration once having been made for one period of elapsing time, the metal impurity concentration in the silicon wafer may be measured and obtained by correcting the measured values with the calibration. As described above, when the metal impurity concentrations by the SPV method are conducted at various measruing points on the silicon wafer, such correction according to the present invention is quite useful if the minority carrier diffusion length varies as the period of elapsing time varies.

(4) The method according to (2), wherein said at least one factor includes a period of elapsing time from the activation in Step (J) to the measurment of the minority carrier diffusion length in Step (K).

According to the present invention, if the dependence has been obtained by the calibration prior to the measurement, the same effect may be expected as described in (3).

(5) The method according to (1) or (2), wherein said at least one factor includes the dopant concentration of said silicon wafer.

According to the present invention, when the dopant concentrations vary from one silicon wafer to another silicon wafer (i.e., the electric resistivity varies among the specimens), the metal impurity concentration can actually be measured with the corresponding correction. When the metal impurity concentrations in various silicon wafers with various dopant concentrations are measured by the SPV method, the metal impurity concentration in the silicon wafer may be obtained more accurately by correcting the measured values with a correction for the different dopant concentrations in the silicon wafers once such a calibration has been made with a silicon wafer with dopant concentration.

(6) The method according to (1) or (2), wherein said at least one factor includes a temperature of said silicon wafer.

According to the present invention, the metal impurity concentration in the silicon wafer may be measured more accurately by correcting the measured values with a corresponding correction even if the temperature of the silicon wafer varies. When the metal impurity concentrations in various silicon wafers at various temperatures are measured by the SPV method, the metal impurity concentration in the silicon wafer may be obtained more accurately by correcting the measured values with a corresponding correction once such a corresponding calibration is made.

(7) The method according to any one from (1) to (6), wherein said metal impurity is iron.

According to the present invention, if the impurity is iron, the iron concentration in the silicon wafer may be obtained more accurately by employing any one of the methods described in from (1) to (6). Here, according to the present invention, the subject metal impurity may comprise a metal impurity, which may yield a donar-acceptor pair (e.g., acceptor such as boron in a p-type silicon and donor), such as a Fe—B pair.

(8) A measurement device comprising: said measurement section; said activation section; said calculation section; said measurement section; and a control section for controlling said activation section and said calculation section, wherein the device performs any one of measurement methods recited in from (1) to (7).

By utilizing a device according to the present invention, the impurity metal concentration in the silicon wafer may be measured with any one of methods recited in from (1) to (7).

(9) The method according to (5), further comprising the steps of: (M) said measurement section conducts at least once more the same measurement of the minority carrier diffusion length as having been conducted after Step (G); (N) said calculation section calculates the dopant concentration by inputting the minority carrier diffusion length in Step (G) and the diffusion length of minority carrier in Step (M).

According to the present invention, if the measurement of the minority carrier diffusion length after the activation is conducted at least once more in the measurement step, the metal impurity concentration may be measured, for example, by obtaining the dopant concentration in case it is unknown.

According to the present invention, at each of a series of measuring points for measuring the minority carrier diffusion length, the metal impurity concentration may be calculated by correcting the measured values with respective calibrations for a resistivity rate of the silicon wafer, a period of time from the activation to the actual measurement of the minority carrier diffusion length, and a varing temperature of the silicon wafer.

Further features of the invention, its nature, and various advantages will be more apparent from the accompanying drawings and the following detailed description of the invention.

DETAILED DESCRIPTION OF THE PREFERRED EMBODIMENTS

Figure 1:
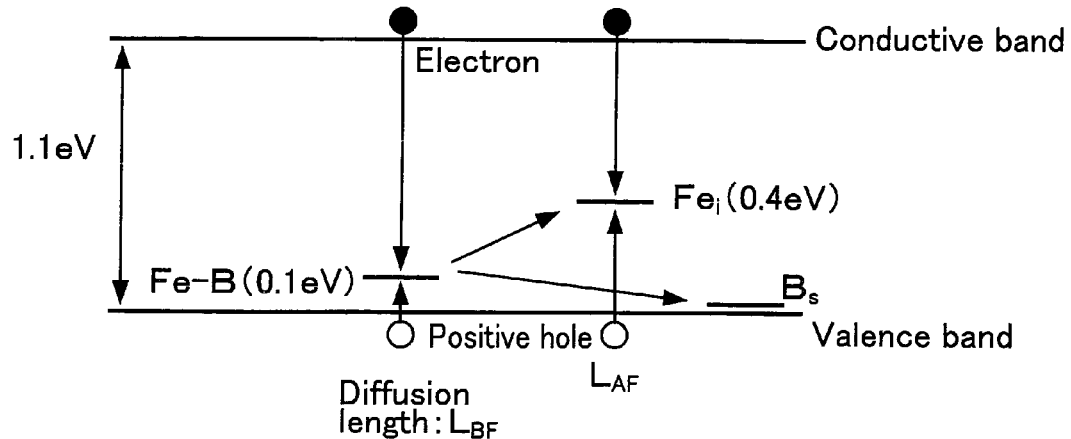
FIG. 1 illustrates the principle of a method for measuring the iron concentration.
Figure 2:
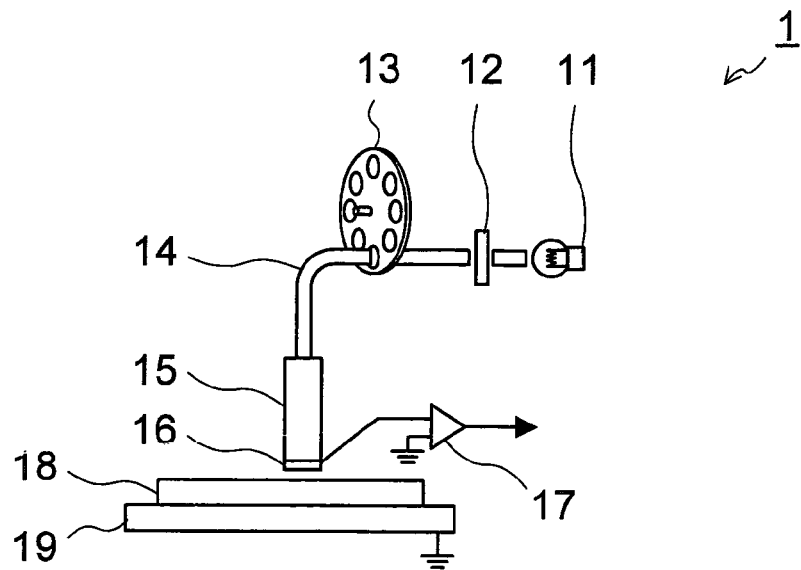
FIG. 2 shows an example of devices for the measurement by the SPV method.
Figure 3:
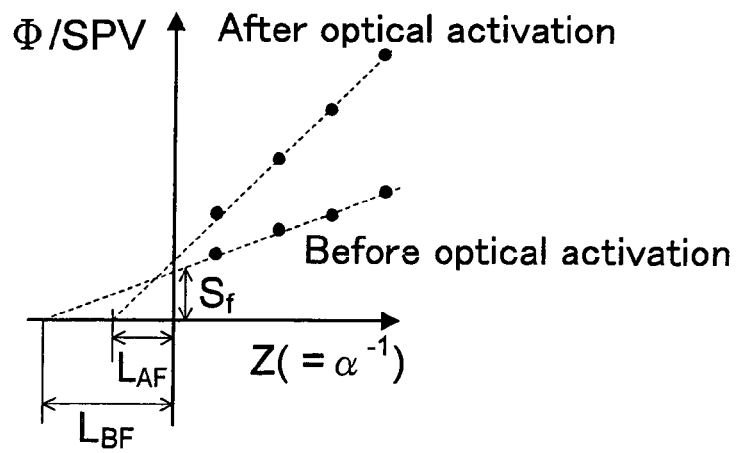
FIG. 3 illustrates the principle to obtain the minority carrier diffusion length from the measurement of surface photovoltages
Figure 4:
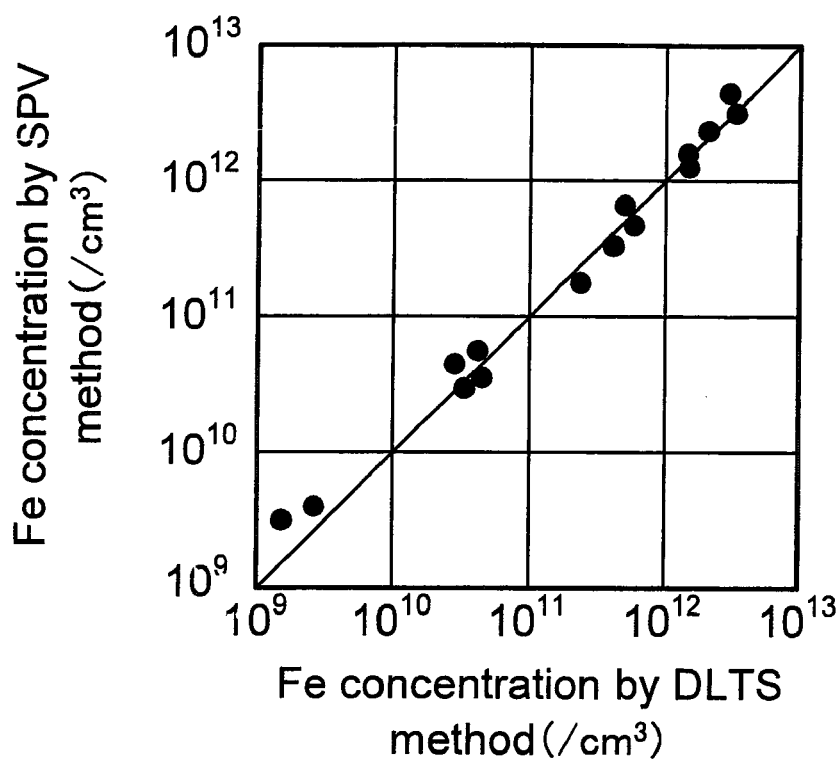
FIG. 4 illustrates comparison of measurement results of iron concentrations by the SPV method and the DLTS method.

Preferred embodiments of the present invention will be described below in reference to the drawings. However, the present invention is not limited to the embodiments, and various modifications and changes in design can be made without departing from the scope of the present invention.

As an example of the embodiments of the present invention, an application to an iron concentration in a silicon wafer will be described. However, the present invention is not limited to the application of the iron concentration, but may be applied to measuring concentrations of various impurities other than iron and the scope of the present invention is not limited to the embodiments.

More specifically, the iron concentration evaluation may be made by replacing the equation (1) with the equation (3).

Eq. (3)

$$N_{Fe} = \frac{D_n}{f\left(C^n_{Fei} - \frac{C^n_{FeB} N_B}{n_i \exp[(E_i - 0.09)/k_B T]}\right)} \left(\frac{1}{L^2_{AF}} - \frac{1}{L^2_{BF}}\right) \quad (3)$$

Here, the following equations describe variables in the equations (1) and (3).

Eq. (4)

$$f = \exp[\tau_C^{-1} t] \quad (4)$$

Eq. (5)

$$\tau_C^{-1} = 4\pi N_B D_{int} R_C \quad (5)$$

Eq. (6)

$$R_C = \frac{q^2}{4\pi \varepsilon_{Si} k_B T} \quad (6)$$

Eq. (7)

$$D_n = \frac{k_B T}{q} \mu_e \quad (7)$$

Eq. (8)

$$\mu_e = \frac{1360}{1 + (N_B/N_{ref})^\alpha} \quad (8)$$

Eq. (9)

$$Dint = (1.0 + 0.8 or - 0.4) \times 10^{-13} \exp\left(\frac{-0.67 \text{ eV}}{k_B T}\right) \quad [\text{cm}^2/\text{s}] \quad (9)$$

Here, t is a period of time elapsing from the activation to the actual measurement.

$C^n$ is each electron capture coefficient. The subscript letters represent states of $Fe_i$, $Fe_B$ (Fe—B pair).

$E_i$ is the intrinsic Fermi level (=0.57 [eV]).

$n_i$ is the intrinsic carrier concentration (=1.45×10$^{10}$ [cm$^{-3}$]).

$k_B$ is Boltzmann's constant (−1.38×10$^{-23}$ [J/K]).

T is the temperature of a silicon wafer.

$N_B$ is the boron concentration wherein the boron is dopant.

$T_C$ is the time constant for the formation of Fe—B pairs.

$D_{int}$ is the intrinsic diffusion coefficient of Fe.

$R_c$ is the coulomb capture radius.

$\varepsilon_{Si}$ is the dielectric constant or permittivity (the relative permittivity of silicon is 12).

$D_n$ is the electron diffusion coefficient.

q is the charge of an electron (=1.6×10$^{-19}$[C]).

$N_{ref}$=1.00×10$^{17}$ [cm$^{-3}$].

$\alpha$=0.5.

In the equations (4) to (6) and (9), since $k_B$, q, $N_{ref}$ and $\alpha$ are known, f may be given as a function of the period of elapsing time t from the activation to the actual measurement, the dopant boron concentration $N_B$, and the temperature T of a silicon wafer. Also, in the equations (7) and (8), since $k_B$, q, $N_{ref}$, $\alpha$ are known, the electron diffusion coefficient $D_n$ may be given as a function of the dopant boron concentration $N_B$ and the temperature T of the silicon wafer. Therefore, if $C^n_{FeB}$ and $C^n_{Fei}$ are fixed, the whole calculation equation (3) may be expressed as a function of diffusion lengths ($L_{AF}$ and $L_{BF}$), and the above parameters (i.e., the temperature T of the silicon wafer, the dopant boron concentration $N_B$, and the period of elapsing time t from the activation to the actual). Here, values of $C''_{FeB}$ and $C''_{Fei}$ are determined so as to fit the iron concentration results calculated by the equation (3) (i.e., by the SPV method) to the iron concentration results measured by the DLTS method with the same silicon wafer that the minority carrier diffusion lengths have been measured by the SPV method. The iron concentration is calculated by applying the equation (3) as determined in this way to the correction equation (described below) for the minority carrier diffusion lengths by the SPV method. Here, the equation (8) is quoted from C. Jacoboni, Solid-State Electronics, vol. 20, pp. 77–89, 1977. And the equation (9) is quoted from Appl. Phys. A69, 13–14 (1999) A. A. Istratov.

Therefore, if the equation (3) is employed, the correction may be made in consideration of the dopant boron concentration $N_B$ of the silicon wafer, the period of elapsing time from the activation to the actual measurement, and the temperature of the silicon wafer.

Further, as described in the above (9), the dopant boron concentration $N_B$ may be given by equations (10) and (11).

Eq. (10)
$$\frac{1}{L_{AF}^2} = \frac{(1-f)C_{FeB}^n N_{Fe} N_B}{D_n n_i \exp[-(E_T - E_i)/k_B T]} + \frac{fC_{Fei}^n N_{Fe}}{D_n} + \frac{1}{L_{others}^2}$$

Eq. (11)
$$\frac{1}{L_{AF2}^2} = \frac{(1-f')C_{FeB}^n N_{Fe} N_B}{D_n n_i \exp[-(E_T - E_i)/k_B T]} + \frac{f'C_{Fei}^n N_{Fe}}{D_n} + \frac{1}{L_{others}^2}$$

Here,

Eq. (12)
$$f = 4\pi\varepsilon_0 R_c D_{int} N_B \times t$$

Eq. (13)
$$f' = 4\pi\varepsilon_0 R_c D_{int} N_B \times t_2$$

$L_{AF}$ and $L_{AF2}$ are the first measured diffusion length and the second measured diffusion length after the activation, respectively.

$t_1$ and $t_2$ are the first period of elapsing time from the activation to the first measurement and the second period of elapsing time from the activation to the second measurement, respectively.

$E_T$ is the energy level of Fe—B pairs.

$L_{others}$ is the contribution from the recombination centers other than Fe—B pairs or Fe interstitial.

The other variables are shown above.

If $C_{FeB}$ and $C_{Fei}$ are obtained by the DLTS method, as shown in the equations (10) and (11), there are two unknown variables: $N_{Fe}$ and $N_B$ since the period of elapsing time, the diffusion lengths and the temperature in the SPV method can be measured. Therefore, $N_{Fe}$ and $N_B$ may be given by solving these simultaneous equations. Further, although the iron concentration may be given with this method, it is preferable to have a small number of measuring points since the measurement throughput is lowered if the number of measuring points in the second evaluation after the activation is increased. Therefore, it is preferable to obtain the electric resistivity (i.e., dopant concentration $N_B$) by using the equations (10) and (11), and to obtain the iron concentration by substituting the electric resistivity into the equation (3).

In the embodiment of the present invention, the electric resistivity to be determined by the boron concentration $N_B$ (the boron is a dopant to the silicon wafer.) may generally range from about 0.05 Ω·cm to about 100 Ω·cm. However, the above range may be derived by a practical measuring technique and should not be limited to this according to the present invention. Therefore, it is conceivable that the electric resistivity is not limited as far as the measuring technique allows. Here, the lower limit of the range may be derived since the Auger recombination comes to contribute, and the upper limit of the range may be derived since the signal intensity is simply lowered or since the boron concentration of approximately $1 \times 10^{14}$ [cm$^{-3}$] is preferable if the contaminated iron concentration is assumed to be approximately $1 \times 10^{14}$ [cm$^{-3}$] such that all Fe atoms may not necessarily form the Fe—B pairs, which may cause the difficulty. As to the period of elapsing time t from the activation to the actual measurement, there is no lower limit in principle if the time can be measured accurately and the upper limit may be determined by the elapsing time until all the interstitial irons having been dissociated by the activation and been back in the Fe—B pair state completely. Therefore, the upper limit may depend on the conditions such that it could be, for example, approximately eight hours if the wafer is kept at approximately 300K and has approximately 1 Ω·cm, and it could be several days if the wafer has approximately 10 Ω·cm.

Figure 5:
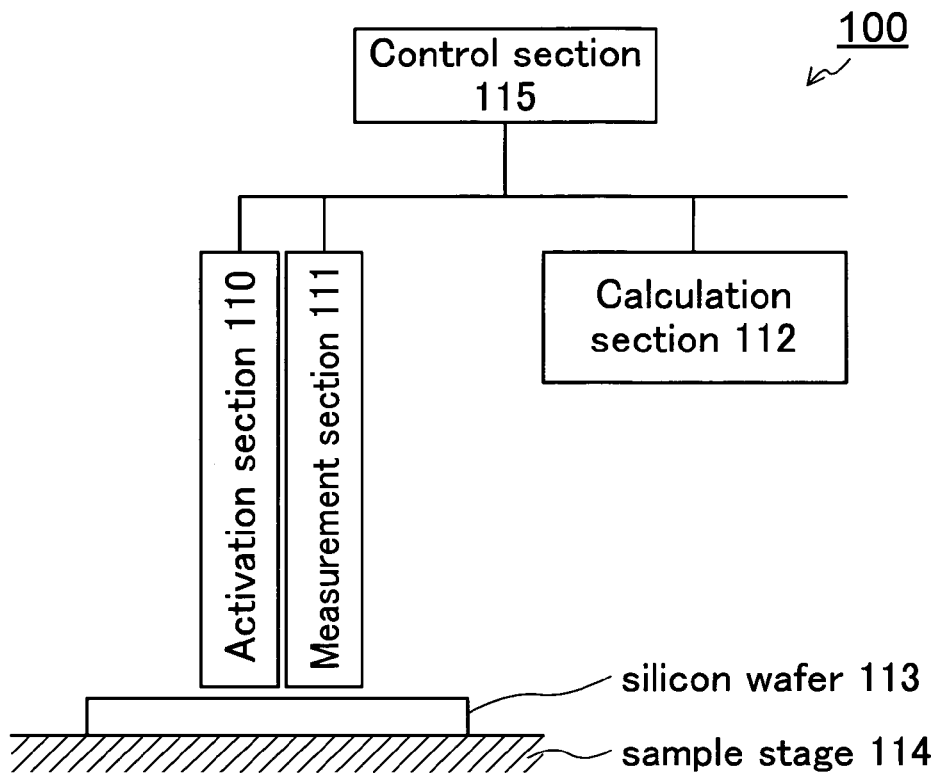
FIG. 5 schematically shows a sample device of the embodiment.

FIG. 5 illustrates an example device for practicing an embodiment of the present invention. A measurement device 100 is provided with an activation section 110 for conducting the activation of the silicon wafer as a specimen, a measurement section 111 for measuring the minority carrier diffusion length, a calculation section 112 for calculating $C''_{FeB}$ and $C''_{Fei}$, and the iron concentration based on the measured values, a sample stage 114, and a control section 115 for controlling the entire measurement device. The silicon wafer as a specimen is denoted by the numerical reference of 113.

Figure 6:
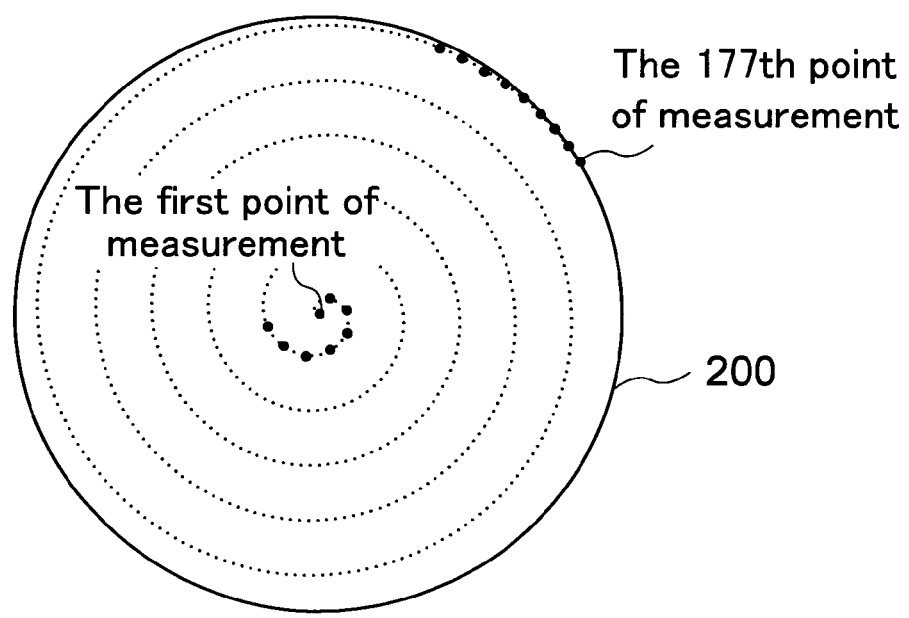
FIG. 6 shows an example for measuring surface photovoltages by the SPV method.

As explained above, the surface photovoltage is measured in a way shown in FIG. 6 such that the measurement is made from the center of the silicon wafer 200 toward the outer periphery in a spiral manner. As shown in FIG. 6, the measurements are conducted at 177 measuring points in total for the silicon wafer 200 having the diameter of 200 mm.

Figure 7:
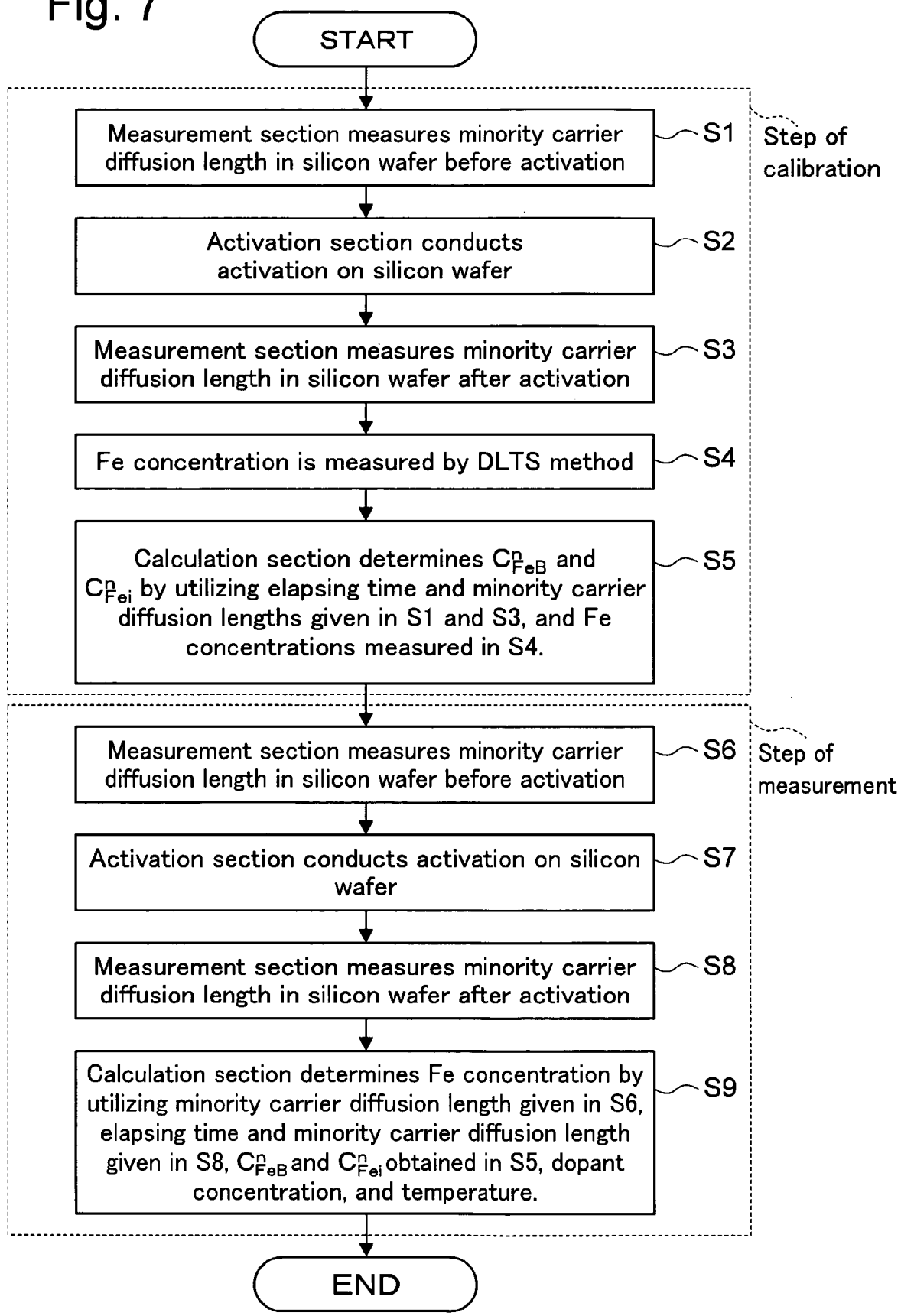
FIG. 7 shows a flow chart for measuring the iron concentration according to an embodiment of the present invention.

In FIG. 7, the procedures of the iron concentration measurement by the SPV method according to the present invention are shown. The measurement section 111 measures the minority carrier diffusion length at one measuring point of the silicon wafer 113 set on the measurement device 100 in accordance with the instruction by the control section 115 (S1). Next, the activation section 110 conducts the activation of the silicon wafer 113 in accordance with the instruction by the control section 115 (S2). Next, the measurement section 111 measures a minority carrier diffusion length at said one measuring point of the silicon wafer 113 in accordance with the instruction by the control section 115 in the same way as described in S1 (S3). Next, the iron concentration of the same silicon wafer 113 is measured by the DLTS method (S4). Next, in accordance with the instruction by the control section 115, the calculation section 112 determines $C''_{FeB}$ and $C''_{Fei}$ as the iron concentrations given by the equation (3) and obtained in Step S4 match with each other by utilizing the minority carrier diffusion lengths obtained in the steps (S1) and (S3), and the iron concentrations measured in Step S4. The foregoing steps from S1 to S5 constitute the calibration step.

Next, the measurement section 111 scans the silicon wafer 113 from the center of the silicon wafer 113 toward the outer periphery in a spiral manner in accordance with the instruction by the control section 115, and then measures the minority carrier diffusion lengths (S6). Next, in accordance with the instruction by the control section 115, the activation section 110 conducts the activation of the silicon wafer 113 (S7). Next, in accordance with the instruction by the control section 115, the measurement section 111 measures the minority carrier diffusion lengths again in the same way as described in Step S6 (S8). Next, in accordance with the instruction by the control section 115, the calculation section 112 calculates the iron concentration with the equation (3) by utilizing $C''_{FeB}$ and $C''_{Fei}$ having been obtained in Step S5, and the minority carrier diffusion lengths having been obtained in Steps S6 and S8 (S9). The foregoing steps from S6 to S9 constitute the measurement step. Then, the above steps from S6 to S9 are repeated if the iron concentration measurement of another silicon wafer is conducted subsequently.

Figure 8:
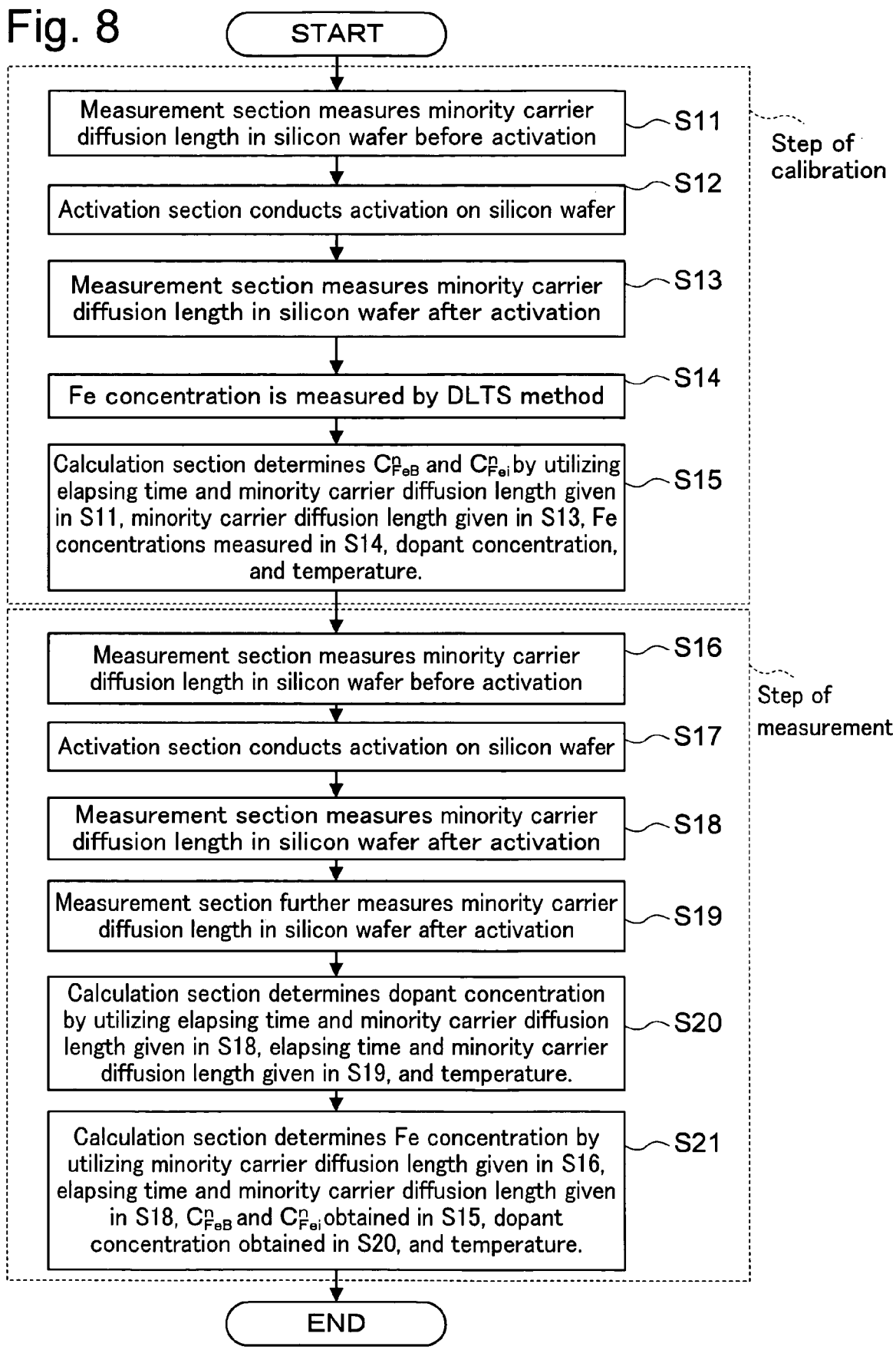
FIG. 8 shows another flow chart for measuring the iron concentration according to another embodiment of the present invention.

In FIG. 8, one example of the procedures in practicing the invention described in (9) is shown. In accordance with the instruction by the control section 115, the measurement section 111 measures the minority carrier diffusion length at one measuring point of the silicon wafer 113 set in the measurement device 100 (S11). Next, in accordance with the instruction by the control section 115, the activation section 110 conducts the activation on the silicon wafer 113 (S12). Next, in accordance with the instruction by the control section 115, the measurement section 111 measures the minority carrier diffusion length at said one measuring point on the silicon wafer 113 again (S13). Next, in accordance with the instruction by the control section 115, the iron concentration in the same silicon wafer 113 is measured by the DLTS method (S14). Next, in accordance with the instruction by the control section 115, the calculation section 112 determines $C''_{FeB}$ and $C''_{Fei}$ as the iron concentrations given by the equation (3) and obtained in Step S14 match with each other by utilizing the minority carrier diffusion lengths obtained in Steps S11 and S13, the periods of elapsing time from the activation to the actual measurement, the iron concentrations measured in Step S14, and temperatures. The foregoing steps from S11 to S15 constitute the calibration step.

Next, in accordance with the instruction by the control section 115, the measurement section 111 scans the silicon wafer 113 from the center of the silicon wafer 113 toward the outer periphery in a spiral manner and then the measurement section 111 measures the minority carrier diffusion length (S16). Next, in accordance with the instruction by the control section 115, the activation section 110 conducts the activation on the silicon wafer 113 (S17). Next, in accordance with the instruction by the control section 115, the measurement section 111 measures the minority carrier diffusion length again in the same way as described in Step S16 (S18). Next, in accordance with the instruction by the control section 115, the measurement section 111 measures the minority carrier diffusion length again at said one measuring point on the silicon wafer in the same way as described in Step S18 (S19). Next, in accordance with the instruction by the control section 115, the calculation section 112 calculates the dopant concentration with the period of elapsing time from the activation to the actual measurement and the minority carrier diffusion lengths having been obtained in Step S18, the period of elapsing time from the activation to the actual measurement and the minority carrier diffusion lengths having been obtained in Step S19, and the temperatures (referring to equations (10) and (11)) (S20). Next, in accordance with the instruction by the control section 115, the calculation section 112 calculates the iron concentration with the equation (3) by utilizing the period of elapsing time from the activation to the actual measurement and the minority carrier diffusion lengths having been obtained in Steps S16 and S18, $C''_{FeB}$ and $C''_{Fei}$ having been obtained in Step S15, the dopant concentration having been obtained in Step S20 and the temperatures (S21). The foregoing steps from S16 to S21 constitute the measurement step.

SIMULATION EXAMPLE 1

Figure 9:
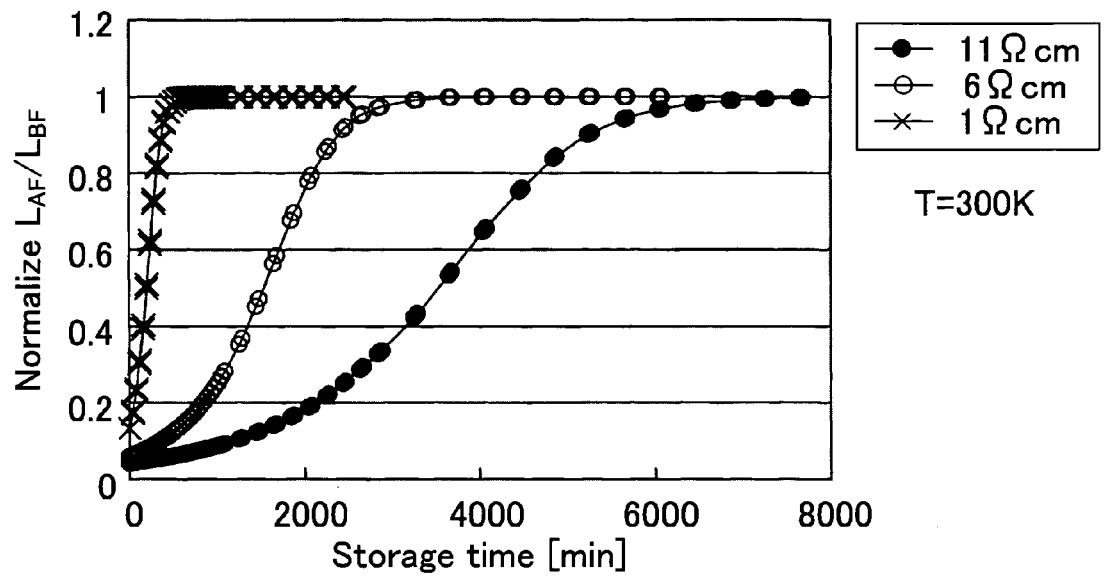
FIGS. 9A and 9B show results of simulation sample 1.
Figure 9:
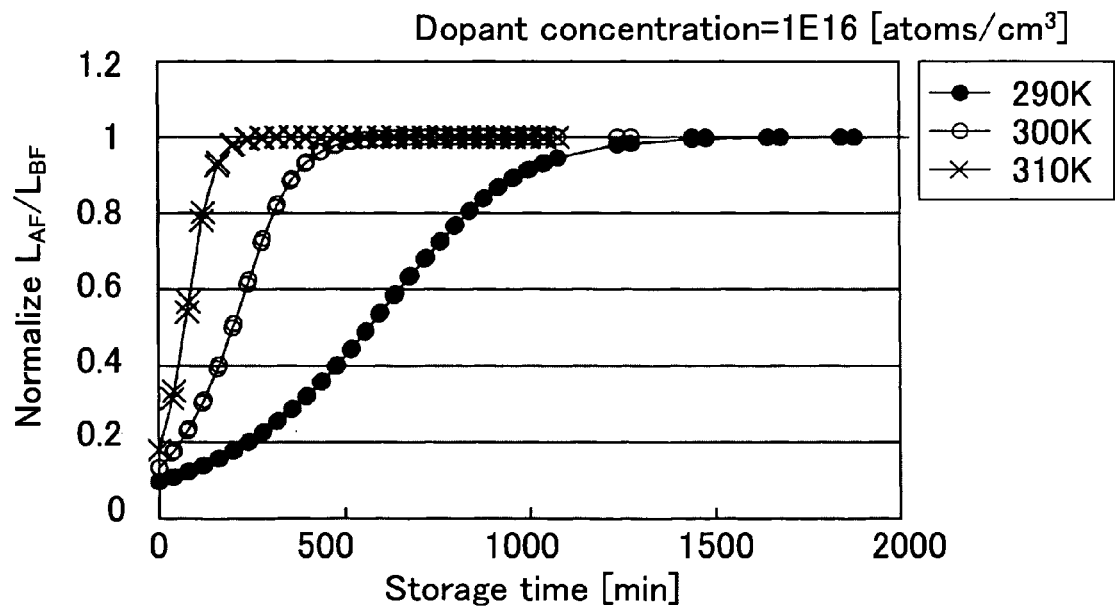
Figure 10:
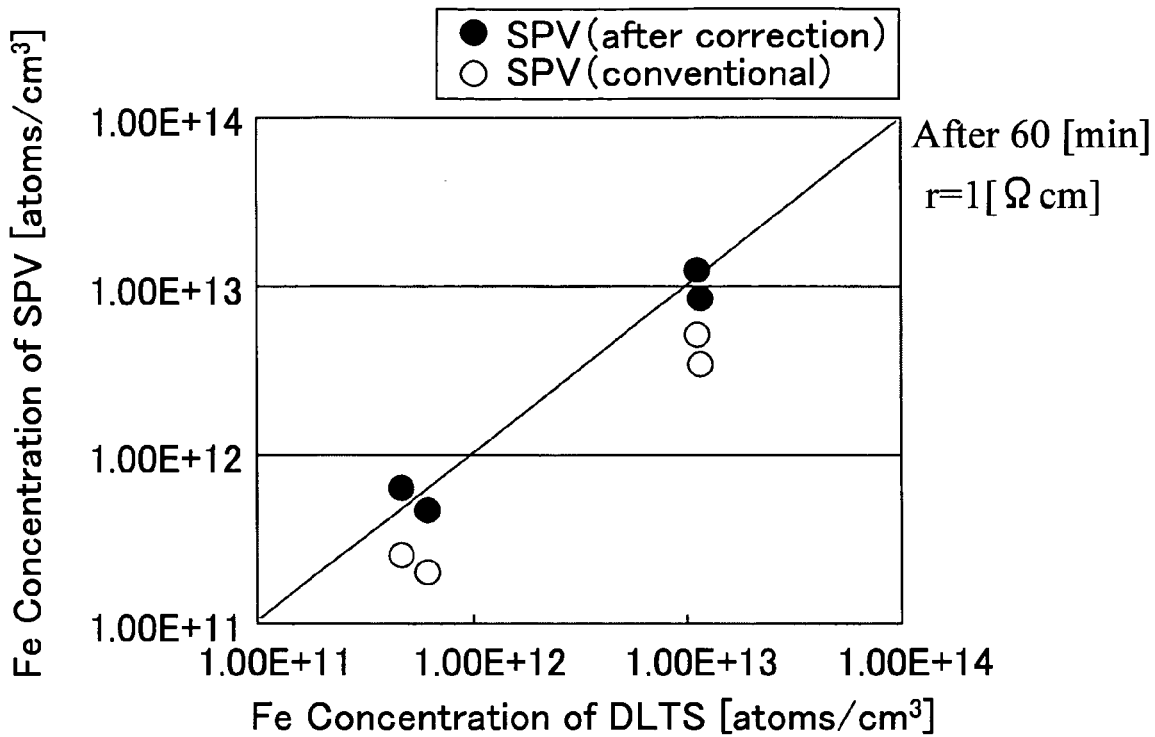
FIGS. 10A and 10B show results of Experiment 1.
Figure 10:
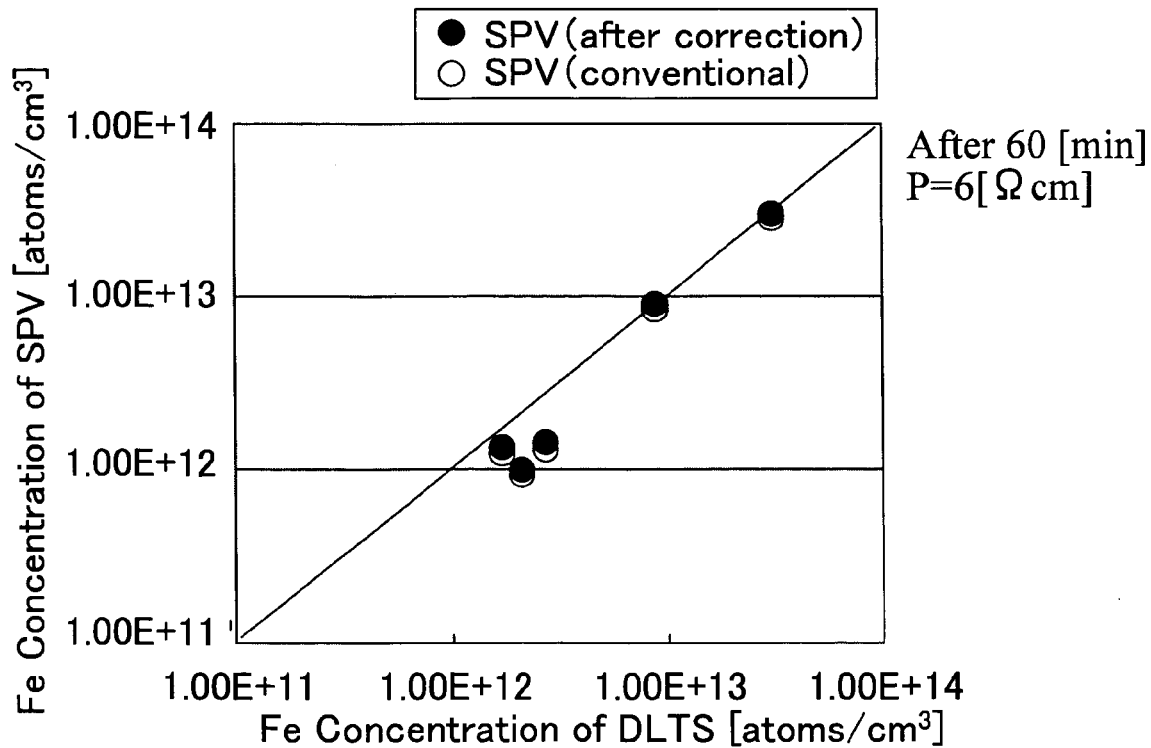
Figure 11:
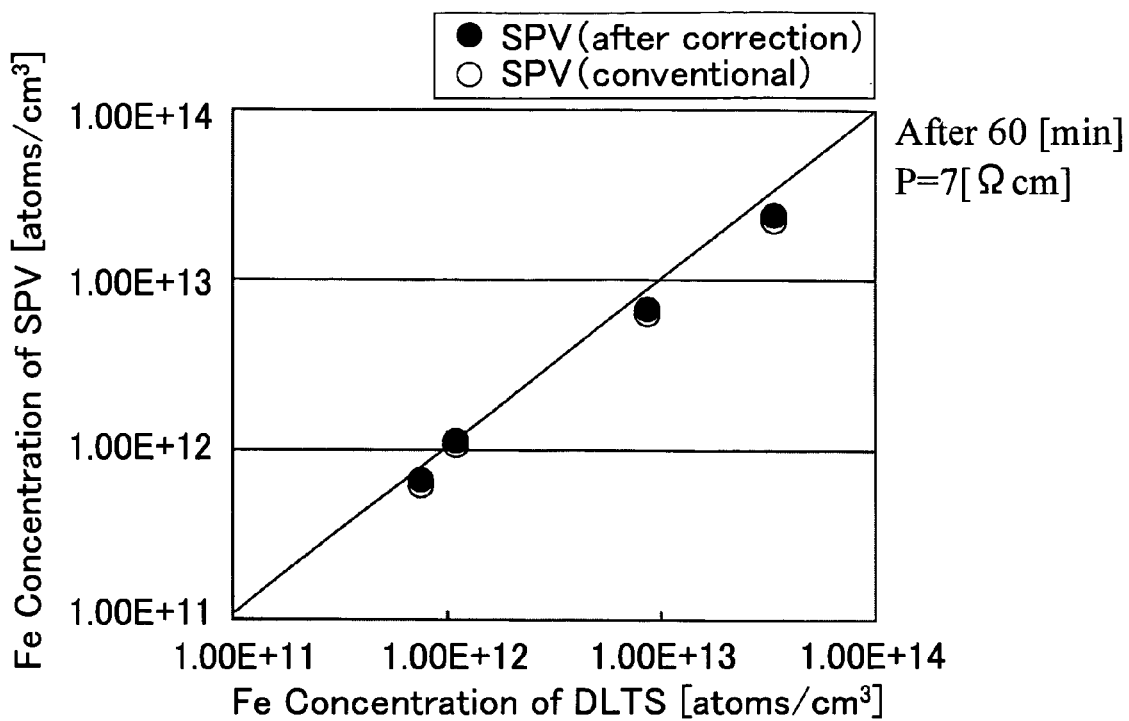
FIGS. 11A and 11B show results of Experiment 2.
Figure 11:
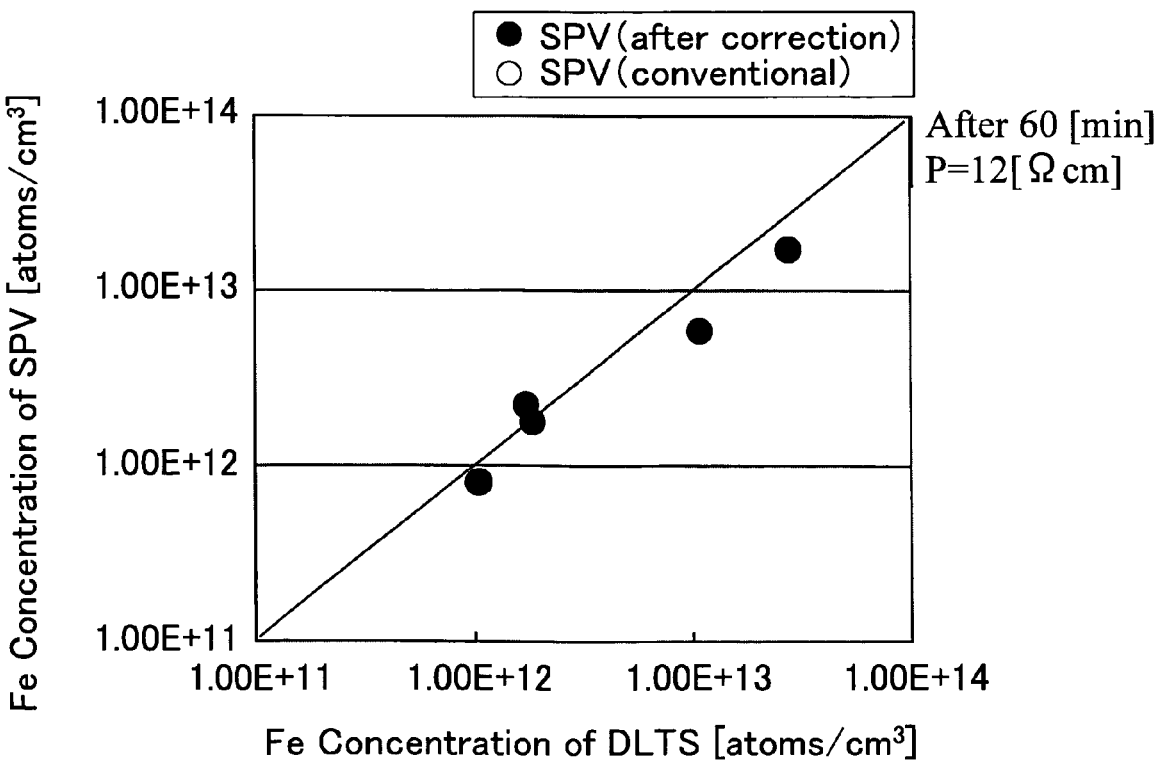
Figure 12:
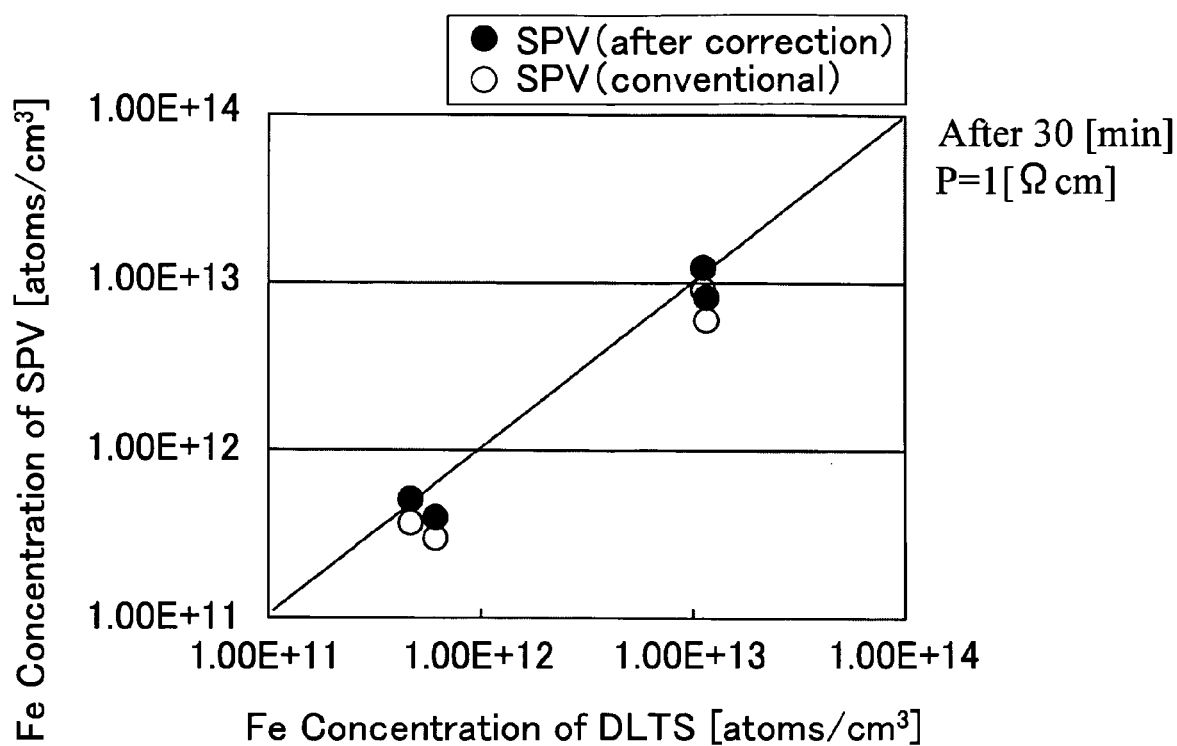
FIGS. 12A and 12B show results of Experiment 2.
Figure 12:
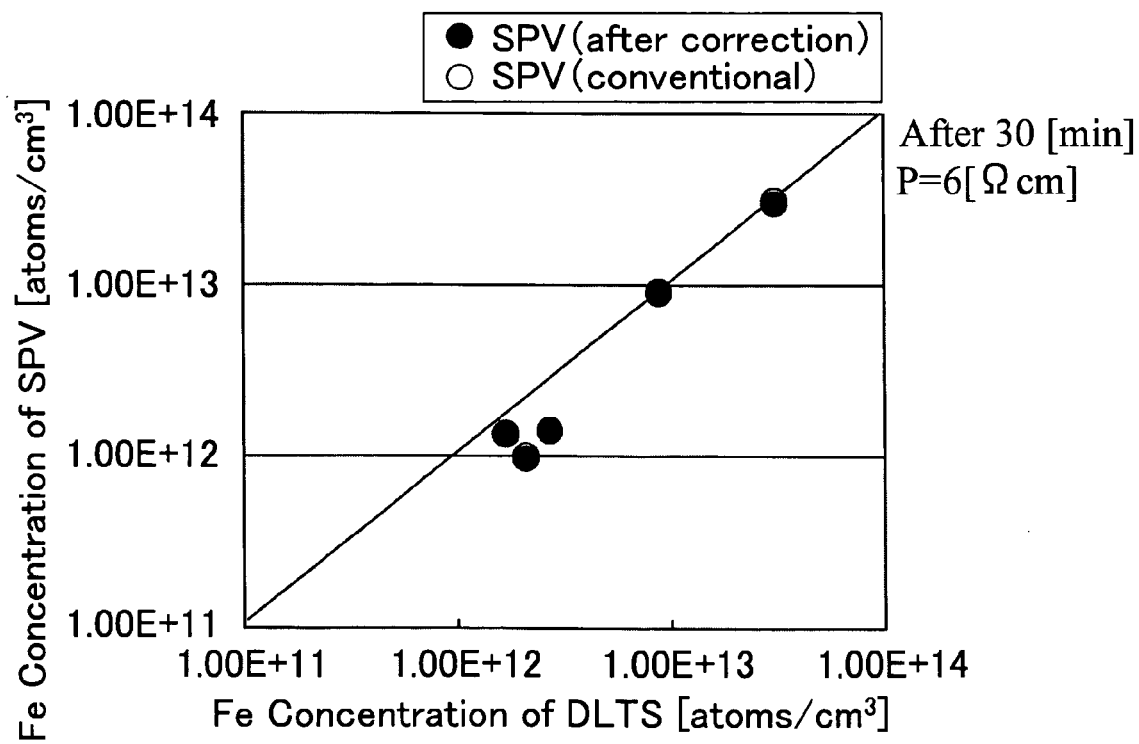

The inventors conducted a simulation to show that the recombination of the interstitial irons with borons may proceed faster as the electric resistivity of the silicon wafer is lower and as the temperature of the silicon wafer is higher. FIG. 9 illustrates actual results of the simulation. For example, in the case of the silicon wafer being kept at 300 K and having the electric resistivity of 11 $\Omega \cdot cm$, $L_{AF}/L_{BF}=0.0420$ immediately after the activation (t=0.1 min) as opposed to $L_{AF}/L_{BF}=0.0487$ at t=200.1 min such that the change thereof is small (a changing rate is 16.0%). On the other hand, in the case of the silicon wafer having the electric resistivity of 1 $\Omega \cdot cm$, $L_{AF}/L_{BF}=0.1328$ immediately after the activation (t=0.1 min) as opposed to $L_{AF}/L_{BF}=0.5105$ at t=200.1 min such that the change thereof is huge (a changing rate is 284.4%). This shows that the recombination of Fe—B pairs proceeds faster in the silicon wafer having a lower rigistivity. Also, in the case of the silicon wafer having the dopant concentration (B) of $1\times10^{16}$ atoms/cm³, $L_{AF}/L_{BF}=0.0964$ immediately after the optical activation (t=0.1 min) if the temperature is 290 K as opposed to $L_{AF}/L_{BF}=0.1222$ at t=76.1 min such that the change is small (the changing rate is 26.8%). On the other hand, if the temperature is 310 K, $L_{AF}/L_{BF}=0.1794$ immediately after the optical activation (t=0.1 min) as opposed to $L_{AF}/L_{BF}=0.5416$ at t=76.1 min such that the change is huge (the changing rate is 201.9%). This shows that the recombination of the Fe—B pair proceeds faster in the silicon wafer at a higher temperature.

[Experiment 1]

The inventors made the measurement of the iron concentration as an experimental example by the SPV method under various conditions with the correction according to the present invention and compared them with the measured values by the DLTS method. FIGS. 10A, 10B, 11A and 11B show the results. A p-type silicon wafer doped with boron as a dopant was used.

Figure 13:
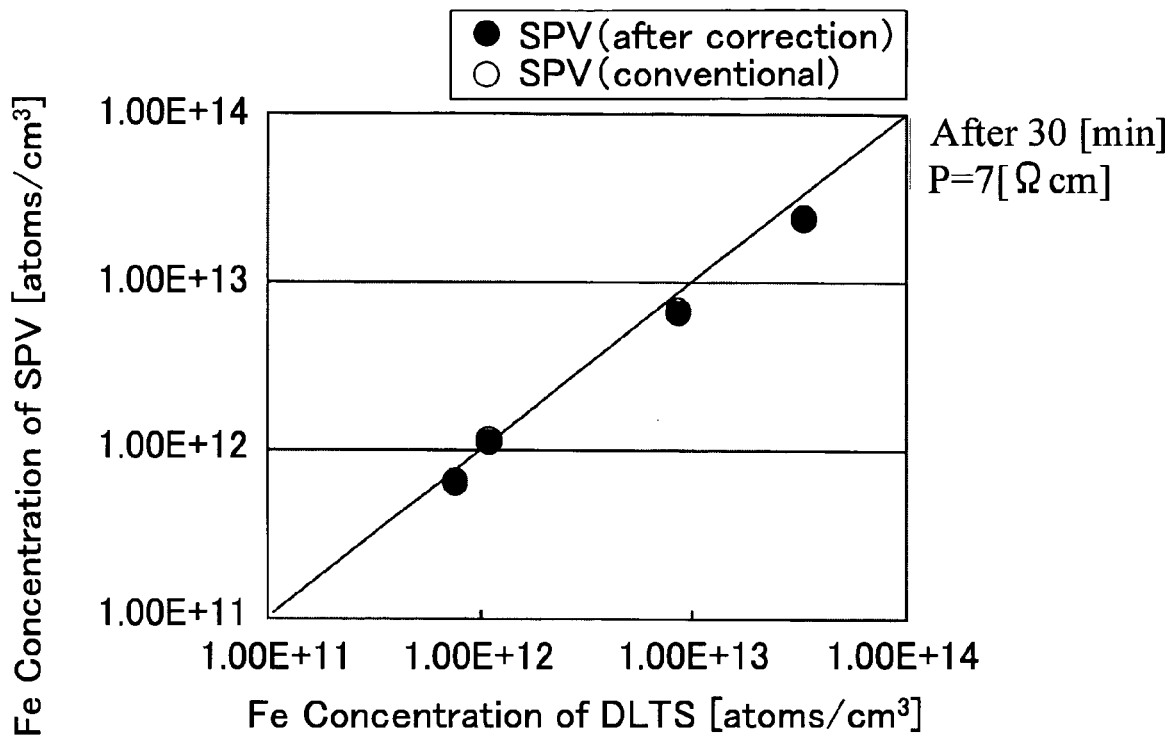
FIGS. 13A and 13B show results of Experiment 2.
Figure 13:
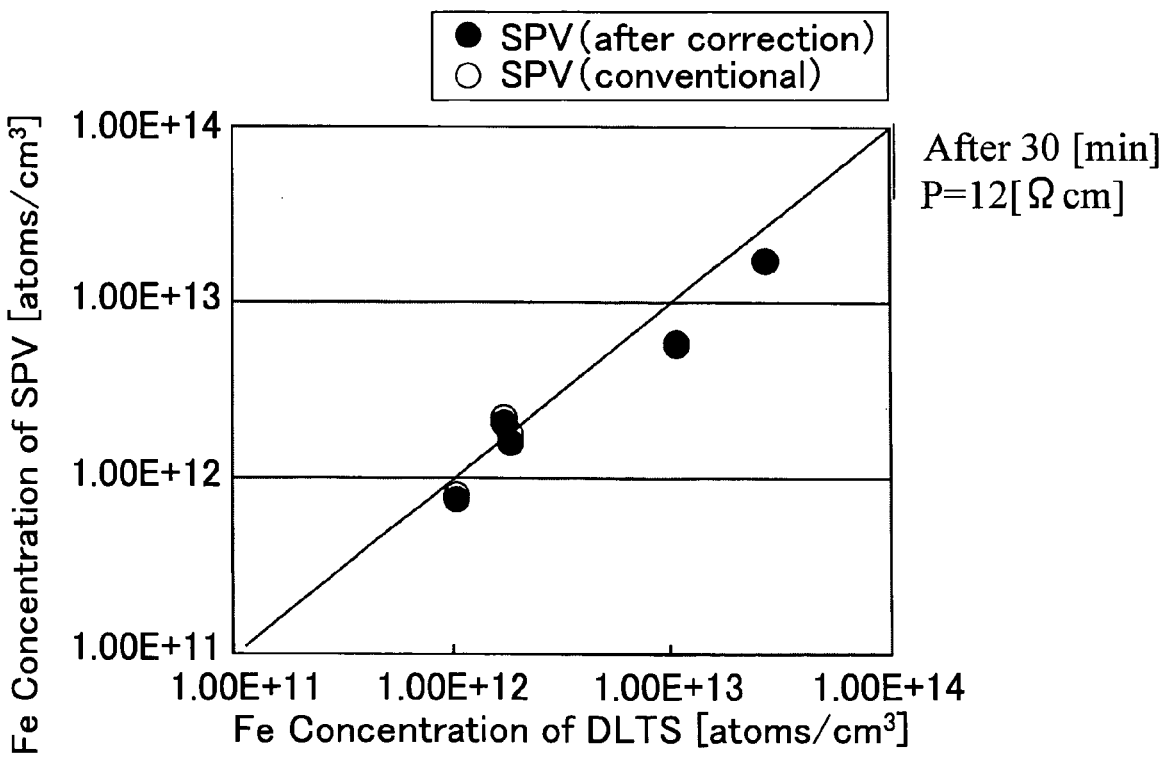

The measurements of the iron concentrations were made at from the light irradiation (optical activation) to the time having elapsed for 60 min with various kinds of specimens having iron concentrations from an order of $1\times10^{11}$ to an order of $1\times10^{14}$. The temperatures of the specimens were from 28.4 Celsius to 29.9 Celsius. As shown in FIGS. 13A and 13B, plots with the conventional correction (by the equation (1)) are lower than the measured values of the iron concentration by the DLTS method while the plots with a correction according to the present invention match well with the measured values of the iron concentration by the DLTS method. Such a difference tends to be bigger as the electric resistivity of the silicon wafer is lowered, and the figure shows the difference becomes even bigger especially with the silicon wafer having the electric resistivity of 1 [$\Omega \cdot cm$].

In the experiments, the following devices were employed.
(a) SPV measurement device: Semiconductor Diagnostics Inc. Station 2030.
(b) DLTS measurement device: Semilab Corp. DLS-83D.

[Experiment 2]

As another experimental example, the inventors made the measurement of the iron concentrations by the SPV method for a different period (30 mins) of elapsing time from the activation to the actual measurement in a similar experiment to the Experiment 1 with the correction according to the present invention and compared the obtained iron concentrations with the measured values by the DLTS method. FIGS. 12A, 12B, 13A and 13B show the results. In FIGS. 12A, 12B, 13A and 13B, there are similar deviations between both concentrations as shown in Experiment 1, but it is understood that the deviations between the results of silicon wafers having the same electric resistivity in Experiments 1 and 2 become less.

In the Experiment 2, the following device was employed.
(a) SPV measurement device: Semiconductor Diagnostic Inc. Station 2030.
(b) DLTS measurement device: Semilab Corp. DLS-83D.

[Experiment 3]

Figure 14:
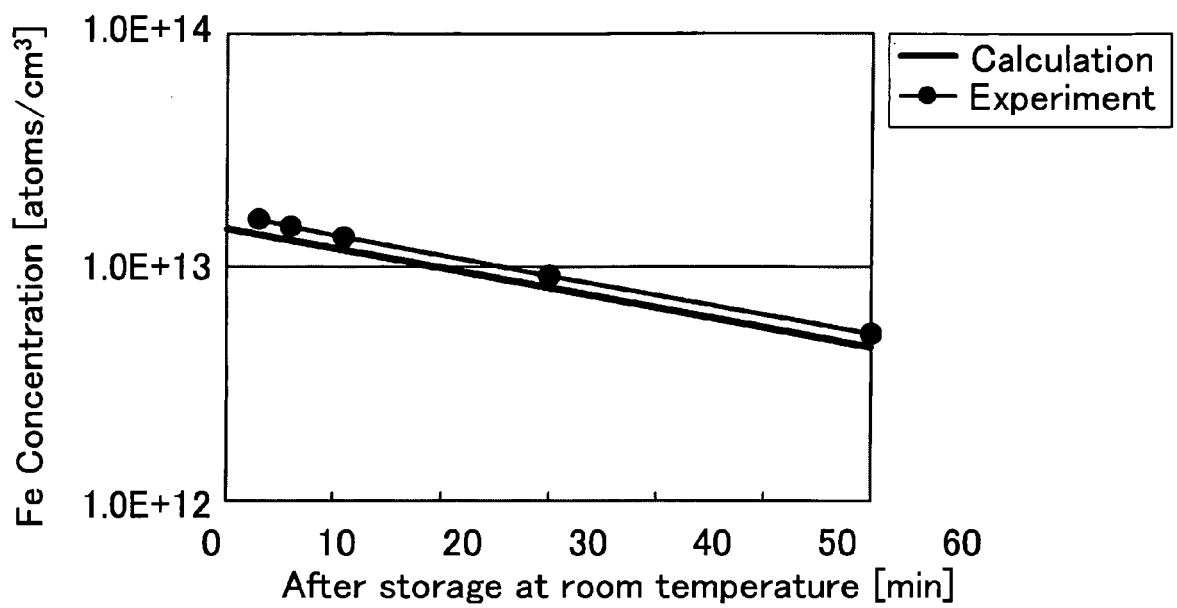
FIG. 14 shows results of Experiment 3.

In another experimental example, the inventors confirmed that the calculated iron concentration without the correction in accordance with the present invention decreased as the period of elapsing time became longer with the silicon wafer being kept at 302 K and having the electric resistivity of 1.28 $\Omega$·cm. FIG. 14 shows the results. A bold solid line indicates the theoretically calculated values and a thin solid line indicates experimental values. It should be understood that the theoretical values and the experimental values match with each other well. Here, the theoretical values and experimental values are slightly offset, but it is intentionally shifted to show the situation well.

In this experiment, the following device was used.
(a) SPV measurement device: Semiconductor Diagnostics Inc. Station 2030.

[Experiment 4]

Figure 15:
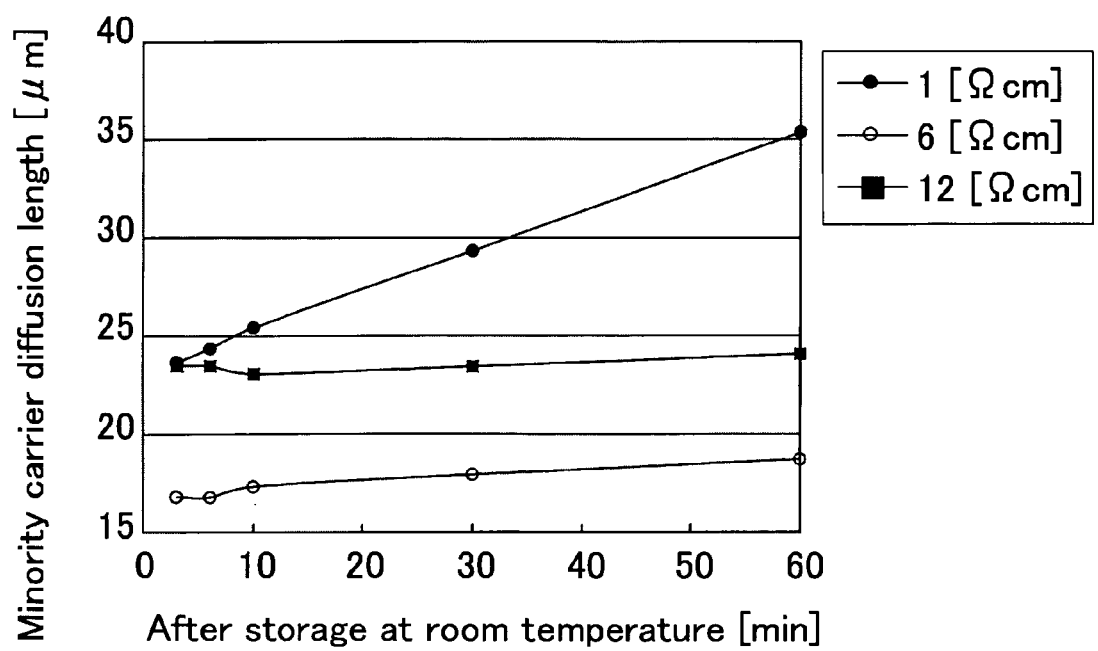
FIG. 15 shows results of Experiment 4.
Figure 16:
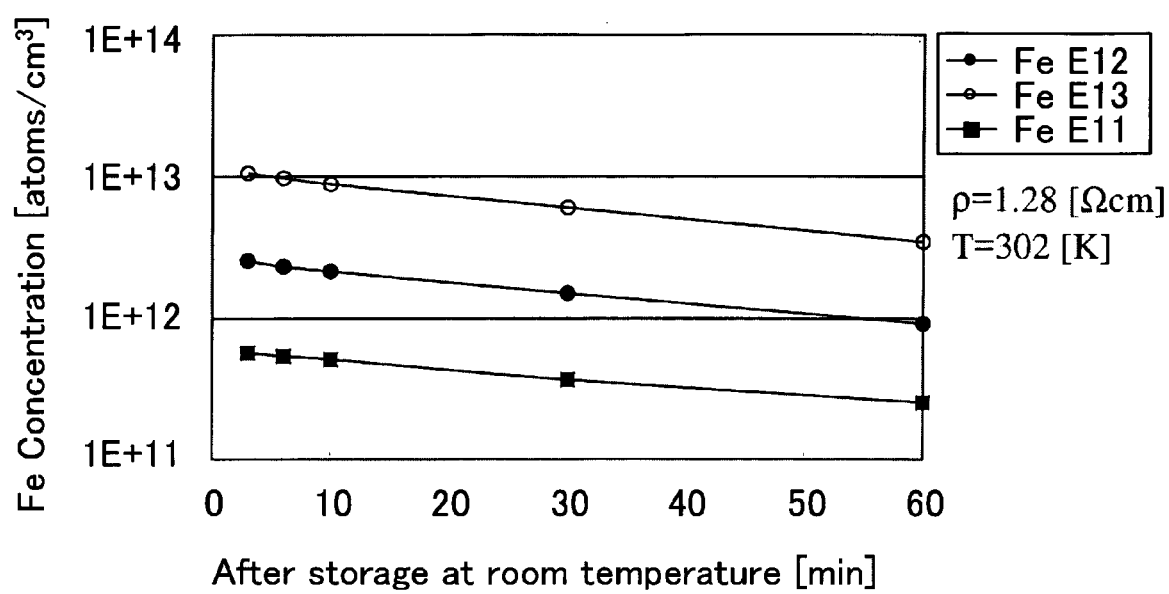
FIG. 16 shows results of Experiment 4.
Figure 17:
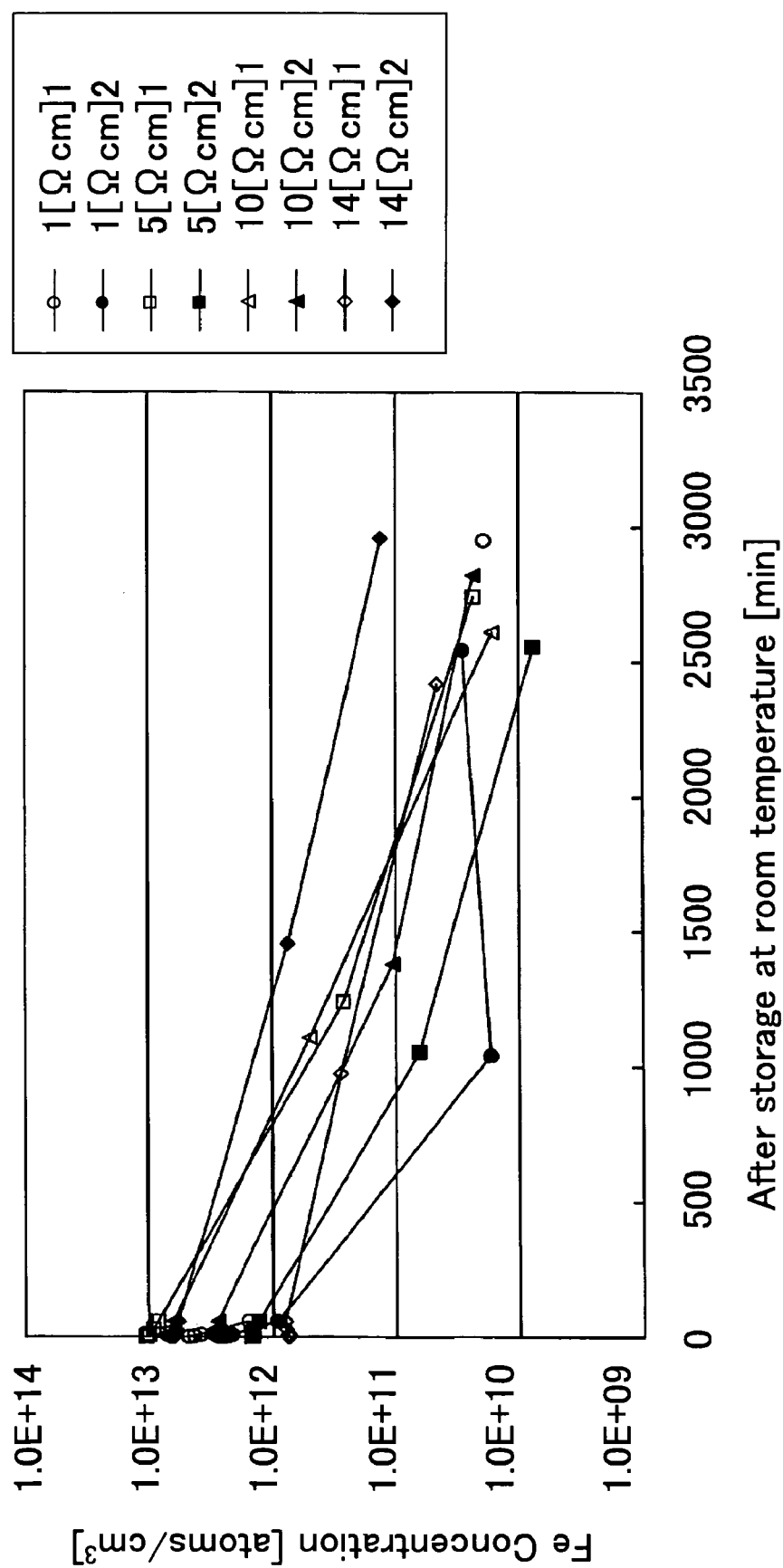
FIG. 17 shows results of Experiment 4.

In another experimental example, the inventors found how the calculated iron concentration without the correction in accordance with the present invention was depended on the period of elapsing time when the electric resistivity and the iron concentration are varied. FIGS. 15 to 17 show the results. FIG. 15 illustrates the time dependency of the minority carrier diffusion length when the electric resistivity is varied. FIG. 16 illustrates the time dependency of the iron concentration calculated without the correction according to the present invention when the iron concentration is varied. FIG. 17 illustrates the time dependency of the iron concentration calculated without the correction according to the present invention when the electric resistivity rate of the silicon wafer is varied. In the figure, the numbers put on the rightmost positions in the box for explaining the kinds of plots indicate how many times the experiments were conducted.

In the experiment, the following device was employed.
(a) SPV measurement device: Semiconductor Diagnostics Inc. Station 2030.

What is claimed is:

1. A method for measuring an iron (Fe) concentration in a silicon wafer by utilizing a surface photovoltage, comprising:

a calibration step; and a measurement step, wherein the calibration step comprises the steps of:

(A) a measurement section measures the minority carrier diffusion length prior to a calibration activation at a measuring point on a calibration silicon wafer;

(B) an activation section conducts a calibration activation on said calibration silicon wafer;

(C) said measurement section measures the minority carrier diffusion length at said measuring point of said calibration silicon wafer after said calibration activation and the iron concentration is measured in a manner which does not use the surface photovoltage, when the iron concentration is unknown;

(D) a calculation section calculates a dependent relationship between the minority carrier diffusion length in Step (C) relative to at least one factor selected from a group including a period of elapsed time, a dopant concentration and a temperature by inputting the minority carrier diffusion length in Step (A) and the minority carrier diffusion length in Step (C);

(E) said measurement section measures a minority carrier diffusion length at a measuring point on a measurement silicon wafer before a measurement activation;

(F) said activation section conducts the measurement activation on said measurement silicon wafer;

(G) said measurement section measures the minority carrier diffusion length at said measuring point on the measurement silicon wafer after the measurement activation; and (H) said calculation section calculates the metal impurity concentration by inputting the minority carrier diffusion length measured in Step (E), the minority carrier diffusion length measured in Step (G), and said dependent relationship such that the iron concentration is calculated.

2. The method according to claim 1, wherein the period of elapsed time of said at least one factor includes a period of elapsed time taken from the calibration activation in Step (B) to the measurement of the minority carrier diffusion length in Step (C).

3. The method according to claim 1, wherein the dopant concentration of said at least one factor includes a dopant concentration in said silicon wafer.

4. The method according to claim 1, wherein the temperature of said at least one factor includes a temperature of said silicon wafer.

5. The method according to claim 3, further comprising the steps of:

(M) said measurement section measures the minority carrier diffusion length at said measuring point on the measurement silicon wafer after Step (G); and (N) said calculation section calculates the dopant concentration by inputting the minority carrier diffusion length in Step (G) and the minority carrier diffusion length in Step (M).

* * * * *